(12) United States Patent
Sharma et al.

(10) Patent No.: US 6,919,594 B2
(45) Date of Patent: Jul. 19, 2005

(54) MAGNETO RESISTIVE STORAGE DEVICE HAVING A MAGNETIC FIELD SINK LAYER

(75) Inventors: Manish Sharma, Sunnyvale, CA (US); Thomas C. Anthony, Sunnyvale, CA (US); Manoj Bhattacharyya, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/696,991

(22) Filed: Oct. 30, 2003

(65) Prior Publication Data

US 2004/0090842 A1 May 13, 2004

Related U.S. Application Data

(62) Division of application No. 10/135,241, filed on Apr. 29, 2002, now Pat. No. 6,794,695.

(51) Int. Cl.[7] .............................................. H01L 29/76
(52) U.S. Cl. ............................................ 257/295; 438/3
(58) Field of Search ................................ 257/295; 438/3

(56) References Cited

U.S. PATENT DOCUMENTS

| 6,127,053 | A | * | 10/2000 | Lin et al. ..................... 428/692 |
| 6,292,389 | B1 | * | 9/2001 | Chen et al. ................. 365/158 |
| 6,509,621 | B2 | * | 1/2003 | Nakao ........................ 257/421 |
| 6,794,695 | B2 | * | 9/2004 | Sharma et al. .............. 257/295 |

* cited by examiner

Primary Examiner—Christian Wilson (57) ABSTRACT

An electro-magnetic device, such as magnetic memory device, is disclosed that includes means for structuring, attenuating or eliminating stray fields at the boundaries that produce an offset in the magneto-resistive response. The device comprises a conductive first layer and the attenuating means comprises a sink layer, electro-magnetically coupled to the first layer, to attenuate the stray boundary magneto-resistive offset at a boundary of the first layer during electrical operation.

5 Claims, 6 Drawing Sheets

MAGNETO RESISTIVE STORAGE DEVICE HAVING A MAGNETIC FIELD SINK LAYER

CROSS REFERENCE TO RELATED APPLICATIONS

This is a divisional of application Ser. No. 10/135,241 filed on Apr. 29, 2002, now U.S. Pat. No. 6,794,695, which is hereby incorporated by.

BACKGROUND OF THE INVENTION

Field of the Invention

The present invention relates generally to magneto-resistive storage devices and, more particularly, the present invention relates to magneto resistive storage devices that minimize magnetic fields at boundary conditions.

Magnetic Random Access Memory ("MRAM") is a non-volatile memory that is being considered for short-term and long-term data storage. MRAM has lower power consumption than short-term memory such as DRAM, SRAM and Flash memory. MRAM can perform read and write operations much faster (by orders of magnitude) than conventional long-term storage devices such as hard drives. In addition, MRAM is more compact and consumes less power than hard drives. MRAM is also being considered for embedded applications such as extremely fast processors and network appliances.

A typical MRAM device includes an array of memory cells, word lines extending along rows of the memory cells, and bit lines extending along columns of the memory cells. Each memory cell is located at a cross point of a word line and a bit line.

The memory cells may be based on tunneling magneto-resistive (TMR) devices such as spin dependent tunneling junctions (SDT). A typical SDT junction includes a reference layer, a sense layer and an insulating tunnel barrier sandwiched between the reference and sense layers. The reference layer has a magnetization orientation that is set in a known direction so as not to rotate in the presence of an applied magnetic field in a range of interest. The sense layer has a magnetization that can be oriented in either of two directions; the same direction as the reference layer magnetization or the opposite direction of the reference layer magnetization. If the magnetizations of the reference and sense layers are in the same direction, the orientation of the SDT junction is said to be "parallel." If the magnetizations of the reference and sense layers are in opposite directions, the orientation of the SDT junction is said to be "anti-parallel." These two stable orientations, parallel and anti-parallel, may correspond to logic values of "0" and "1."

The reference layer described above can be made using a soft magnetic layer that is set dynamically by magnetic field from a current-carrying conductor. Alternatively, the magnetization orientation of the pinned layer may be fixed by an underlying antiferromagnetic (AF) pinning layer. The AF pinning layer provides a large exchange field, which holds the magnetization of the pinned layer in one direction. Underlying the AF layer are usually first and second seed layers. The first seed layer allows the second seed layer to be grown with a <111> crystal structure orientation. The second seed layer establishes a <111> crystal structure orientation for the AF pinning layer.

Figure 1:
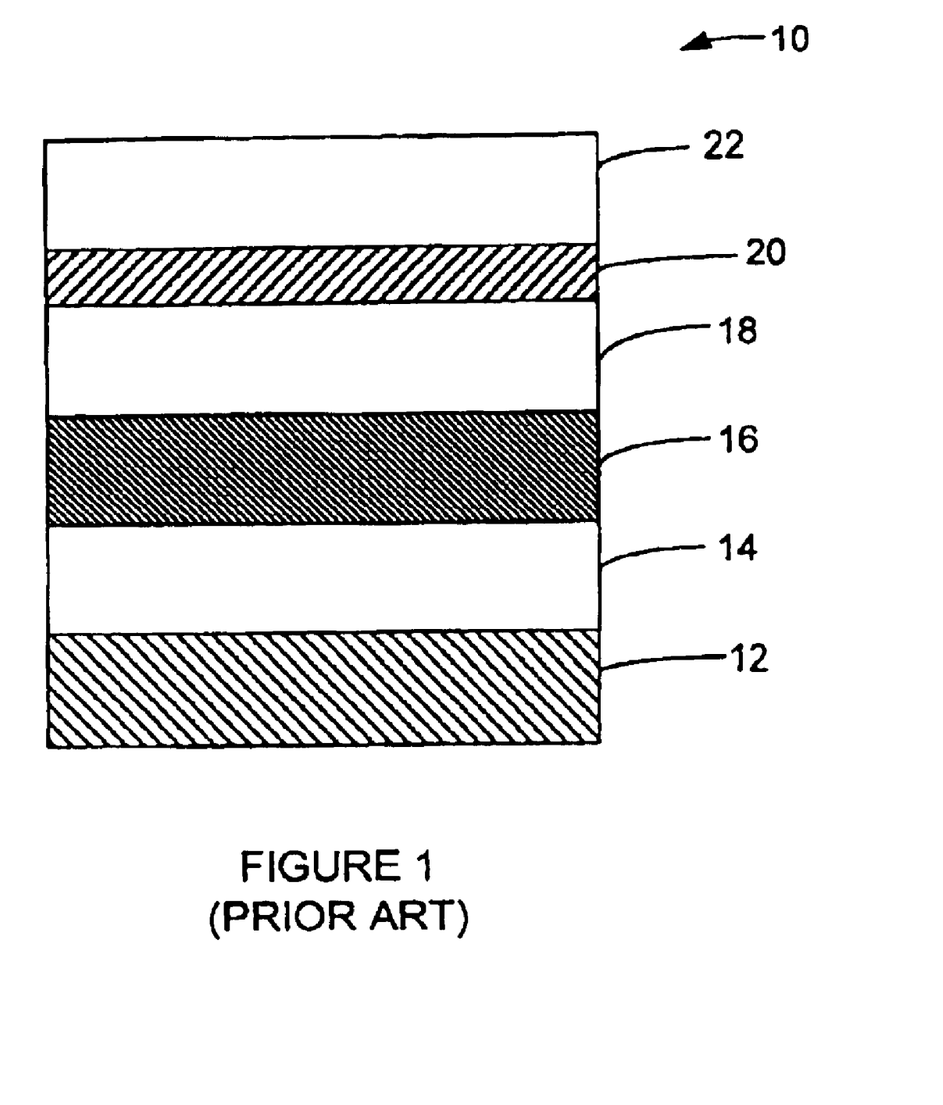
FIG. 1 illustrates a cross-sectional side view of a magneto-resistive storage device according to the prior art.

Prior art examples of magneto-resistive devices having AF pinning layers are shown in FIG. 1. FIG. 1 depicts a magnetic tunnel junction 10 consisting of several layers, including multiple ferromagnetic layers. Layer 12 is a non-magnetic conductive layer, typically fabricated from tantalum or copper, or other like materials. On layer 12 is fabricated a magnetic seed layer 14, which may be substituted with a fully patterned ferromagnetic seed layer. An AF pinning layer 16 is then fabricated on layer 14 with a ferromagnetic pinned layer 18 being fabricated on layer 16. The tunneling barrier 20, typically made of a dielectric material such as alumina or silicon dioxide, is fabricated on layer 18. Lastly, a ferromagnetic sense layer 22 is fabricated on the barrier layer 20 to complete the magnetic tunnel junction device 10. Strong, stray magnetic fields are produced at the edges of the ferromagnetic layers 14, 18 and 22. The strong stray magnetic fields assist switching of data films in one direction and oppose switching in the reverse direction. This creates an asymmetry in switching.

Accordingly, what is needed is a structure that reduces or eliminates the stray magnetic fields produced at the edges of the ferromagnetic layers within the magnetic tunnel junction devices of the prior art.

SUMMARY OF THE INVENTION

According to the present invention, an electro-magnetic device, such as a magnetic memory device, is disclosed that includes means for attenuating, reducing or eliminating stray boundary magneto-resistive offset. The device comprises several layers amongst which is a first layer with stray magnetic fields at its boundaries. The attenuating means comprises a sink layer, magnetically coupled to the first layer, to attenuate the stray magnetic fields of the first layer.

In one embodiment, a magnetic memory device is disclosed that includes means for reducing or eliminating magneto-resistive switching offset. The device comprises a sense layer; a pinned layer; a barrier layer placed between the sense and pinned layers such that each layer is geometrically aligned with the other; a pinning layer placed in adjacent alignment with the pinned layer; and a magnetic sink layer, placed adjacent to the pinning layer, to minimize stray magnetic field effects at the boundaries of the sense, pinned and pinning layers. The magnetic sink layer comprises a magnetic layer having a first portion in adjacent alignment with the pinning layer, the first portion functioning as a pinned layer, and a second unpinned portion, extending beyond the alignment of the other layers and the first portion.

Additional features and advantages of the invention will be apparent from the detailed description which follows, taken in conjunction with the accompanying drawings, which together illustrate, by way of example, features of the invention.

BRIEF DESCRIPTION OF THE DRAWINGS

FIG. 9 illustrate the offset effects of the seed layers in accordance with the present invention (FIG. 9a) and as compared to the prior art (FIG. 9b).

DETAILED DESCRIPTION OF SPECIFIC EMBODIMENTS

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

Figure 2:
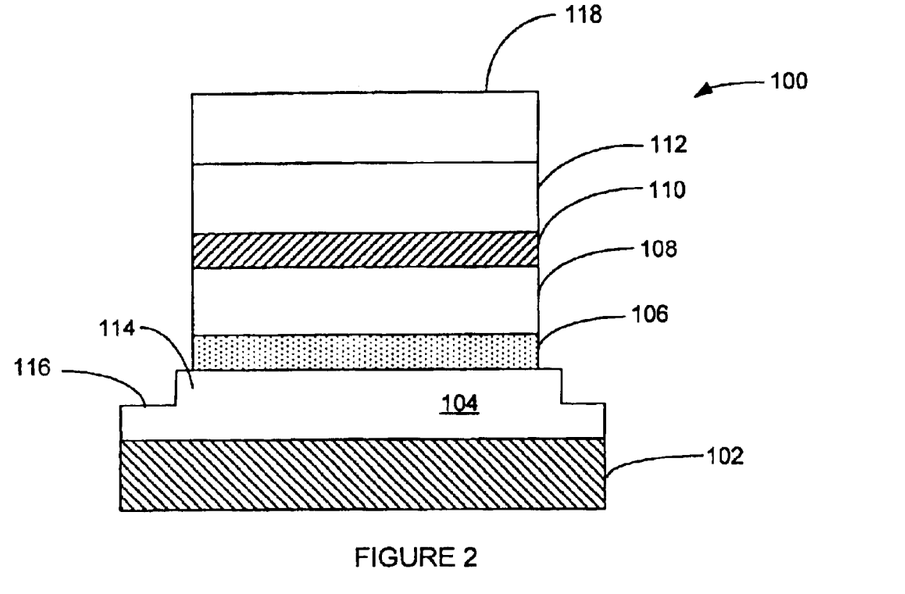
FIG. 2 illustrates a cross-sectional view of a magneto-resistive storage device that includes a magnetic sink layer in accordance with the present invention.

FIG. 2 illustrates a cross-sectional view of a magnetic memory device 100, also known as a memory device stack or memory stack, that includes a conductive seed layer 102, a second seed layer 104, a magnetic tunnel junction formed by a pinning layer 106, a pinned layer 108, a barrier layer 110, a sense layer 112 and a second conductive layer 118. The seed layer 104 also serves as a magnetic sink layer in accordance with the present invention. The magnetic memory device 100 further includes a non-ferromagnetic conductive layer 102. Both sense layer 112 and pinned layer 108 are made of a ferromagnetic material. The pinned layer 108 serves as a reference layer and has a magnetization that is fixed in one direction. The sense layer 112 serves as a data layer and has a magnetization that can be oriented in either of two directions.

If the magnetization vectors (not shown) of the pinned layer 108 and the sense layer 112 are pointing in the same direction, the orientation of the spin dependent tunnel (SDT) junction formed by the sense layer 112, barrier layer 110 and pinned layer 108, is said to be "parallel." If the magnetization vectors of the sense layer 112 and the pinned layer 108 are pointing in opposite directions, the orientation of the magnetic tunnel junction is said to be "anti-parallel." These two stable orientations, parallel and anti-parallel, correspond to logic values of "0" and "1."

Barrier layer 110 is typically an insulating tunnel barrier that allows quantum mechanical tunneling to occur between sense layer 112 and pinned layer 108. This tunneling phenomena is electron-spin dependent, causing resistance of the magnetic tunnel junction to be a function of the relative orientations of the magnetization vectors of the pinned layer 108, and the sense layer 112. For instance, the resistance of the magnetic tunnel junction is a first value (R) if the magnetization orientation of the magnetic tunnel junction is parallel and a second value (R+ΔR) if the magnetization orientation is anti-parallel. The insulating tunnel barrier 110 may be made of aluminum oxide ($Al_2O_3$), silicon dioxide ($SiO_2$), tantalum oxide ($Ta_2O_5$), silicon nitride ($SiN_x$), aluminum nitride ($AlN_x$), or magnesium oxide (MgO). Other dielectrics and certain semiconductor materials may be used for the insulating tunnel barrier 110. The thickness of insulating barrier 110 may range from about 0.5 nanometers to about 3 nanometers.

Potential ferromagnetic layer materials include nickel, iron, cobalt or alloys of these materials. For example, pinned layer 108 may be made of a material such as NiFe or CoFe, and the sense layer may be made of the same material or a different material such as, for example, NiFeCo.

The sense layer 112, also referred to as the free or data layer, is fabricated of a ferromagnetic material whose magnetization is free to switch from one direction to the other. The other layer consists of a ferromagnetic pinned layer 108, which has its magnetization pinned by the presence of an adjacent anti-ferromagnetic pinning layer 106. This makes the magnetization of pinned layer 108 fixed in a certain direction. Second conductor layer 118 serves to carry a current on sense layer 112 during operation and actually operates as a bit line within a memory array where bottom conductor 102 serves as a word line within the array.

Layer 102 serves two purposes. Layer 102 first serves as the bottom conductor to provide a path for electrical current to flow during specific operations. Second, layer 102 serves as a seed layer. Layer 102 may be fabricated from such well-known materials as Cu, Ta, Ta/Ru, or Cu/Ru multilayer combinations, among others. The materials are selected because of their ability to promote subsequent growth of films with <111> crystal texture. This allows for subsequent deposition of a layer of NiFe on the layer 102 to have higher <111> orientation of its crystal texture. This growth orientation is needed to achieve the pinning effect in the subsequent stack where even layers 106 and 108 have the <111> texture, which is necessary to promote pinning.

Seed layer 104 also serves as a magnetic sink layer. Seed layer 104 actually comprises two separate regions such as a second pinned layer 114 and extension layer 116, which provides much of the magnetic sink capability of layer 104 and which can also extend beyond the dimensions of the rest of the stack. Pinned layer 114 is formed so as to be substantially self-aligned with layers 106, 108, 110 and 112. This means that a portion of layer 104 is removed to yield the shoulders represented by the boundary of layer 116 with layer 114 and shoulders represented by the boundary of layer 114 with layer 106. Layer 104 is fabricated upon a conductive layer 102, which serves to seed the growth of layer 104. Seed layer 104 allows for the pinning layer 106 to be aligned in a crystal structure orientation of <111>.

Magnetization oriented perpendicular to the end boundaries defining layers 108 and 112 generate strong magnetic fields due to the small geometries of these layers. The magnetic fields associated with the boundaries cause problems with respect to setting the pinned layer during fabrication, and also setting the sense layer during a write operation and performing reads of the sense layer during a sense operation. Further problems are associated with affecting the bits within adjacent magnetic memory devices. Since the material utilized to fabricate the seed layer 104 is manufactured from a ferromagnetic material, it is proposed that by extending the support surface area beyond the boundary of the remaining layers, a magnetic sink layer is formed. The magnetic sink layer serves to modify, by either controlling, reducing or eliminating, the strongly magnetic field effects normally associated with the boundaries of layers 108 and 112.

In the embodiment shown in FIG. 2, layer 104 is partially patterned to reveal a step border that extends beyond the top surface area of each layer subsequently placed upon layer 104. In an alternative embodiment, layer 104 need not be patterned, but is fabricated to extend beyond the top surface area of the layers subsequently manufactured thereon.

Figure 3:
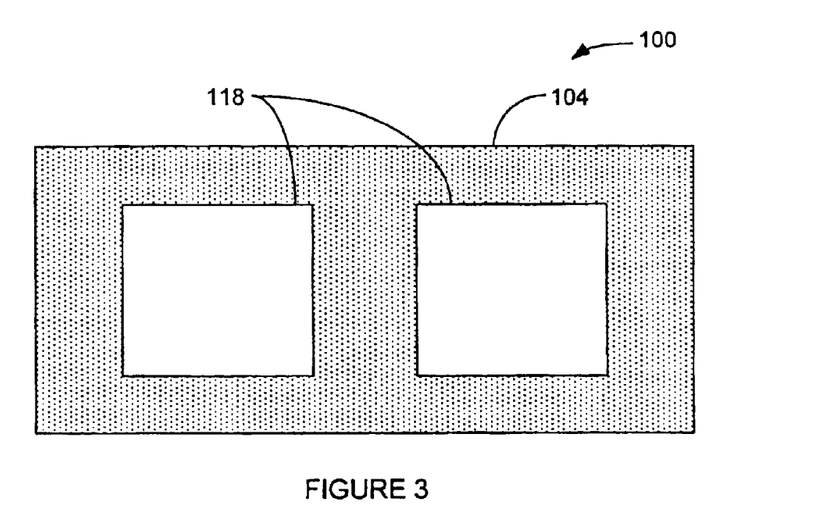
FIG. 3 illustrates a top plan view of two magneto-resistive storage devices sharing a common magnetic sink layer in accordance with the present invention.

In yet another embodiment, as illustrated in the top plan view of FIG. 3, a magnetic memory device that comprises a spin dependent tunneling (SDT) junction is depicted. The magnetic sink layer 104 is sufficiently large that two layers forming two separate magnetic bits, as represented by the top plan view of layer 118, can fit on layer 104. This illustrates that the magnetic sink layer can accommodate a plurality of magnetic memory devices rather than serve one device exclusively. As such, it is contemplated that entire lines of hundreds, if not thousands, of memory devices may share a common magnetic sink layer 104. In such an example, the sink layer 104 would extend along virtually the entire length (or width) of the array.

The simplest design is when layer 114 and subsequent layers have the exact same dimensions and only layer 116 is larger, typically 2–10 times larger. However, it is also possible that the dimensions of layer 114 need not be exactly the same as that of subsequent layers (106, 108, 112 etc.). They are typically close in size, such that layer 114 does not become the sink layer itself and layer 116 performs much, if not all the sink effect. In one specific embodiment, layer 114 has dimensions the same as the subsequent layers or modestly larger, such as about 10–20% larger. Of note, the area covered by the extension of layer 114 is limited by the separation between bits along rows or columns so as not to overlap with any other adjacent layer 114 within the array. This is so even though layer 116 is selected to be larger than layer 114.

Figure 9A:
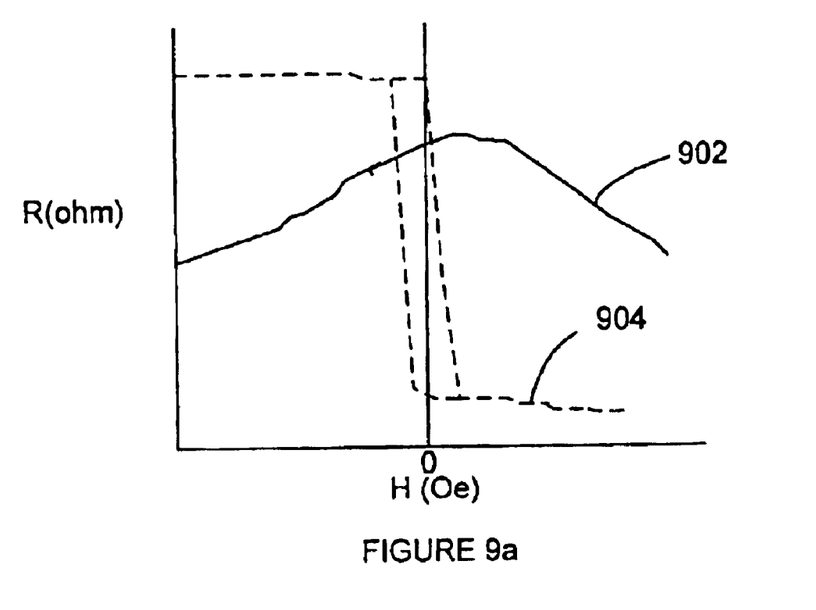
Figure 9B:
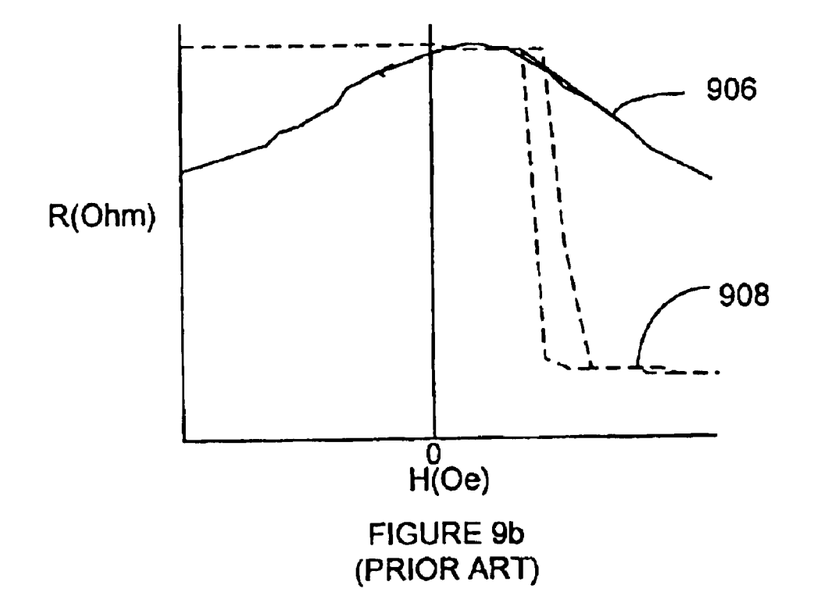

FIG. 9a illustrates the offset effects on device 100 where the seed layers 102 and 104 are magnetic, where layer 102 is formed of Ta and layer 104 is formed of NiFe. The magnetic seed layer reduces the magnetic offset substantially as shown in the loop. The hard axis loop is shown at 902 while the easy axis loop is shown at 904. FIG. 9b illustrates the offset effects where the seed layers 102 and 104 are non-magnetic, where layer 102 is made of Ta and layer 104 is made of Ru, as found in the prior art. This results in a magnetic offset that is quite large. The hard axis is shown at 906 while the easy axis is shown at 908. In the example of FIG. 9a, the seed layer is unpatterned. A patterned NiFe seed layer results in additional offset. In both cases, all other layers were same.

Additionally, the amount of offset produced changes if the ratio of the thicknesses of layer 114 and boundary layer 116 is changed (i.e., how deep the combined 104 layer is patterned). Further, the lateral dimensions of the bit or sense layer 112 are important in determining how much offset is present. If the bit is 1.0 micron by 2.0 microns in size and approximately 5.0 nm thick, a certain offset is achieved. If bit 112 is formed from the exact same materials and the size changes to 0.5 micron×1.0 micron in size, the offset could be approximately twice as large as the larger bit. So, the thickness of layers 114 and 116 used to compensate for the offset will also be determined by the size of the bits being patterned. Specifically, with the presence of the magnetic sink layer, the offsets are reduced and the variation in the offsets with the size of the bits is also reduced.

The magnetic sink layer 104 serves to remove the offset in any magneto-resistance (R-H) curves. Further, with the stray magnetic fields being reduced, if not eliminated, tighter tolerances may be accepted to create greater densities of magnetic memory devices within a common array. This results in smaller overall arrays with greater storage capacity.

Figure 4:
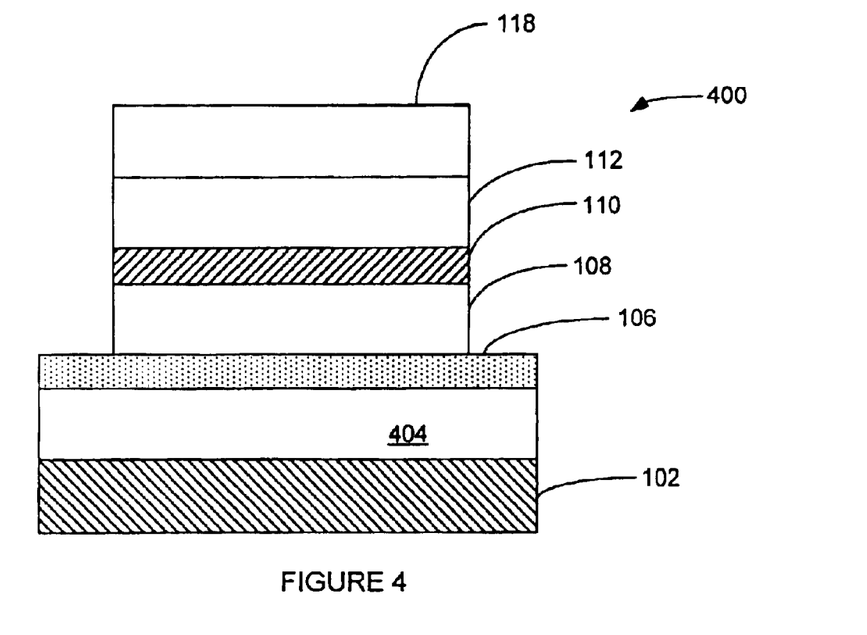
FIG. 4 illustrates a cross-sectional view of an alternative embodiment of a magneto-resistive storage device that includes a magnetic sink layer in accordance with the present invention.

FIG. 4 is a cross-sectional illustration of an alternative embodiment of a bottom spin valve memory device, shown in stack 400, where seed layer 404 serves as a sink layer, and is fabricated similarly to layer 104 of FIG. 2. No shoulders are patterned in layer 404 as was done in layer 104 to form additional layers 114 and 116. Further, pinning layer 106 is fabricated to have approximately the same area dimensions as seed layer 404. The remaining layers, pinned layer 108, barrier layer 110 and sense layer 112 are the same as those previously illustrated in FIG. 2.

Figure 5:
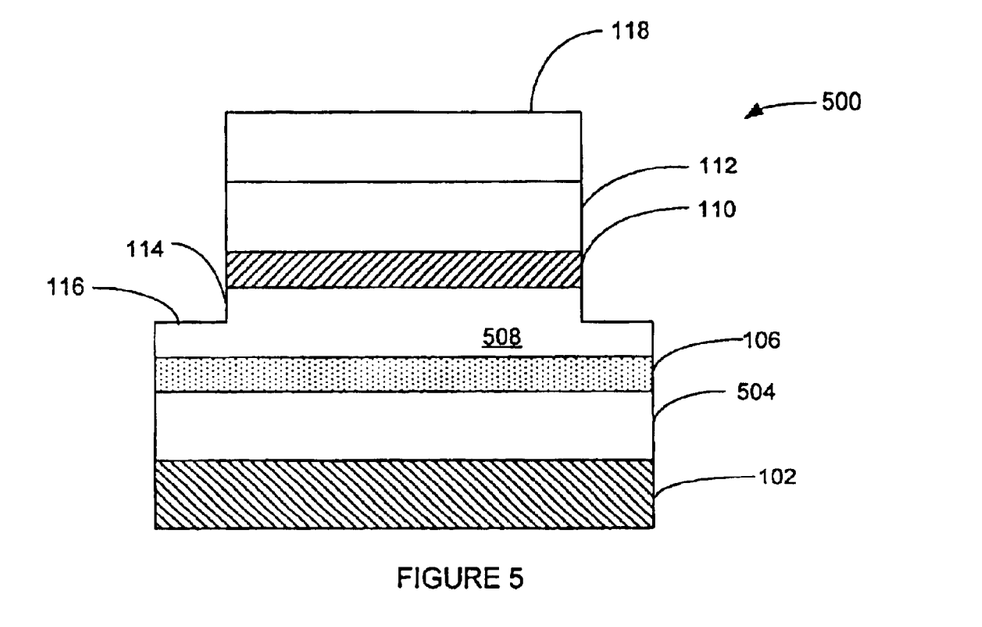
FIG. 5 illustrates a cross-sectional view of an alternative embodiment of a magneto-resistive storage device that includes a magnetic sink layer in accordance with the present invention.

FIG. 5 is a cross-sectional illustration of an alternative embodiment of a bottom spin valve memory device, shown in stack 500, where seed layer 504 replaces seed layer 104 of FIG. 2. Seed layer 504 is made of a non-magnetic material such as Ru or Cu. A separate sink layer is formed in FM pinned layer 508. In this case, layer 508 is fabricated to have shoulders to define seed layer 114 and sink layer 116, as previously fabricated in layer 104 of FIG. 2, but is illustrated such that layer 114 approximately conforms to layer 110. Pinning layer 106 is fabricated to have approximately the same area dimensions as seed layer 504 and the sink layer 116 portion of layer 508. The barrier layer 110 and sense layer 112 are unchanged from previously described embodiments.

Figure 6:
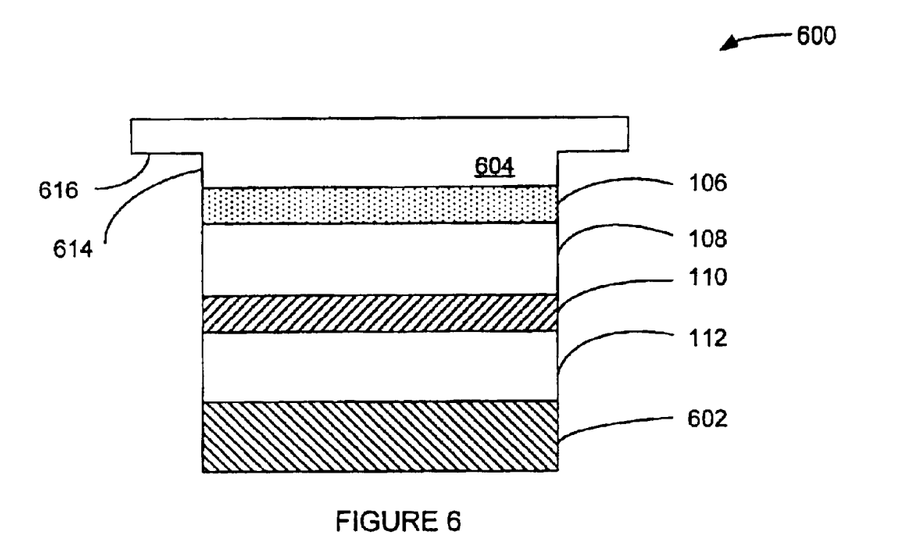
FIG. 6 illustrates a cross-sectional view of an alternative embodiment of a magneto-resistive storage device that includes a magnetic sink layer in accordance with the present invention.

Although the embodiments of FIGS. 2, 4 and 5 represent bottom spin-valve memory devices, top spin-valve memory devices are also contemplated in order to remove the magnetic offset. The top spin-valve structures typically invert the layer orientation and order shown in FIG. 2. FIG. 6 depicts a cross-sectional view of a top spin-valve structure in accordance with the present invention and is depicted as stack 600. Thus, layer 112 is fabricated on a seed layer 602, which is fabricated from Ta or Ta/Ru, and serves as the seed layer for layers below barrier layer 110. Barrier layer 110 is formed on layer 112 and a pinned layer 108 formed on barrier layer 110. Layer 108 serves as the seed layer for subsequent layers, such as pinning layer 106, which is formed thereon. A magnetic sink layer 604 is formed on layer 106 and has shoulders that are inverted compared to the shoulders on layer 104 of FIG. 2. Accordingly, layer 614 is formed adjacent to layer 106, and layer 616 is formed on layer 614 and serves primarily as the sink layer to reduce or eliminate the offset in the R-H curve caused by magnetic fields at the edge boundaries of the lower layers. Layer 614 may also be fabricated to extend beyond the area of layer 106, but with area less than layer 616.

Figure 7:
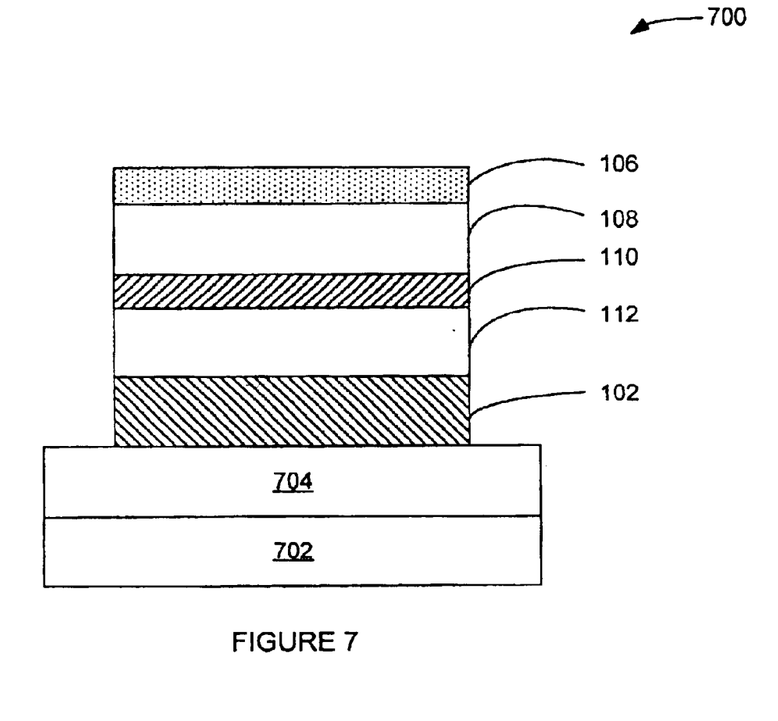
FIG. 7 illustrates a cross-sectional view of an alternative embodiment of a magneto-resistive storage device that includes a magnetic sink layer in accordance with the present invention.

FIG. 7 depicts a cross-sectional view of an alternative top spin-spin valve structure in accordance with the present invention and is depicted as stack 700. First, a sink layer 704 is fabricated on the conductor layer 102. Next, a non-magnetic seed layer 702 is fabricated on sink layer 704 and functions much like seed layer 602 of FIG. 6. Layer 112 is then fabricated on seed layer 702, which is fabricated from Ta, Ta/Ru, Ta/Cu or Cu/Ru. Together, the layers 102, 704 and 702 serve as the seed layer for layers below barrier layer 110. Barrier layer 110 is formed on layer 112 and pinned layer 108 formed on layer 110. Layer 108 serves as the seed layer for subsequent layers, such as pinning layer 106, which is formed thereon. Layer 704 serves to reduce or eliminate the R-H offset curve caused by the lower layers at the edge boundaries.

In one specific embodiment, the magnetic sink layer has a sheet size ranging from five (5) to ten (10) times the sheet size of the bit layers. Alternatively, the magnetic sink layer 104 may be only two (2) to five (5) times the bit size. Of course, the magnetic sink layer can serve to attenuate the offset in the R-H curve for more than one memory bit, so these dimensions are merely representative for single bit implementation and are not to be duly limiting.

Sense layer 112 serves as the bit for each cell within the array and is in contact with barrier layer 110. Second conductor 118 is a top lead that serves as the bit line that extends along the Y axis and is in contact with 110. The first layer 102 serves as a second conductor extending along the X axis and is in contact with the magnetic sink layer 104. Conductor layer 102 is made of an electrically conductive, non-magnetic material such as aluminum, copper, gold, silver, or tantalum.

Data may be written to the magnetic tunnel junction formed by the sense layer 1112, barrier layer 110 and pinned layer 108 by applying write currents in the conductive layer 118 and the conductive layer 102. Electrically, the layers 118 and 112 form one conductor and the layers 102, 104, 106 and 108 form a second conductor. Thus, current flowing along the conductor layer 118 generates one magnetic field about sense layer 112 and the current flowing through conductor layer 102 generates another magnetic field. The two magnetic fields, when combined, exceed the coercivity of the sense layer 112 and, therefore, cause the magnetization vector of the sense layer 112 to be set in a desired orientation, depending upon the directions and magnitudes of the currents supplied to layers 102 and 118. One magnetization orientation defines a logic value 1 and the other a logic value 0. After the write currents are removed, the magnetization vector of the sense layer 112 retains its orientation.

In order to read the contents of the magnetic memory device 100, a voltage is applied across the magnetic tunnel junction via conductive layer 118 and conductive layer 102. The voltage causes a sense current to flow through the magnetic tunnel junction formed between the sense layer 1112, pinned layer 108 and the barrier layer 110 sandwiched between sense layer 1112 and pinned layer 108.

The resistance of the magnetic tunnel junction is measured by sensing the current flowing through the magnetic tunnel junction. The sensed current is inversely proportional to the resistance of the magnetic tunnel junction. Thus, $I_S=V/R$ or $I_S=V/(R+\Delta R)$, where V is the applied voltage, $I_S$ is the sensed current, R is the nominal resistance of the device 100, and $\Delta R$ is the change in resistance caused by going from a parallel magnetization orientation to an antiparallel magnetization orientation.

Figure 8:
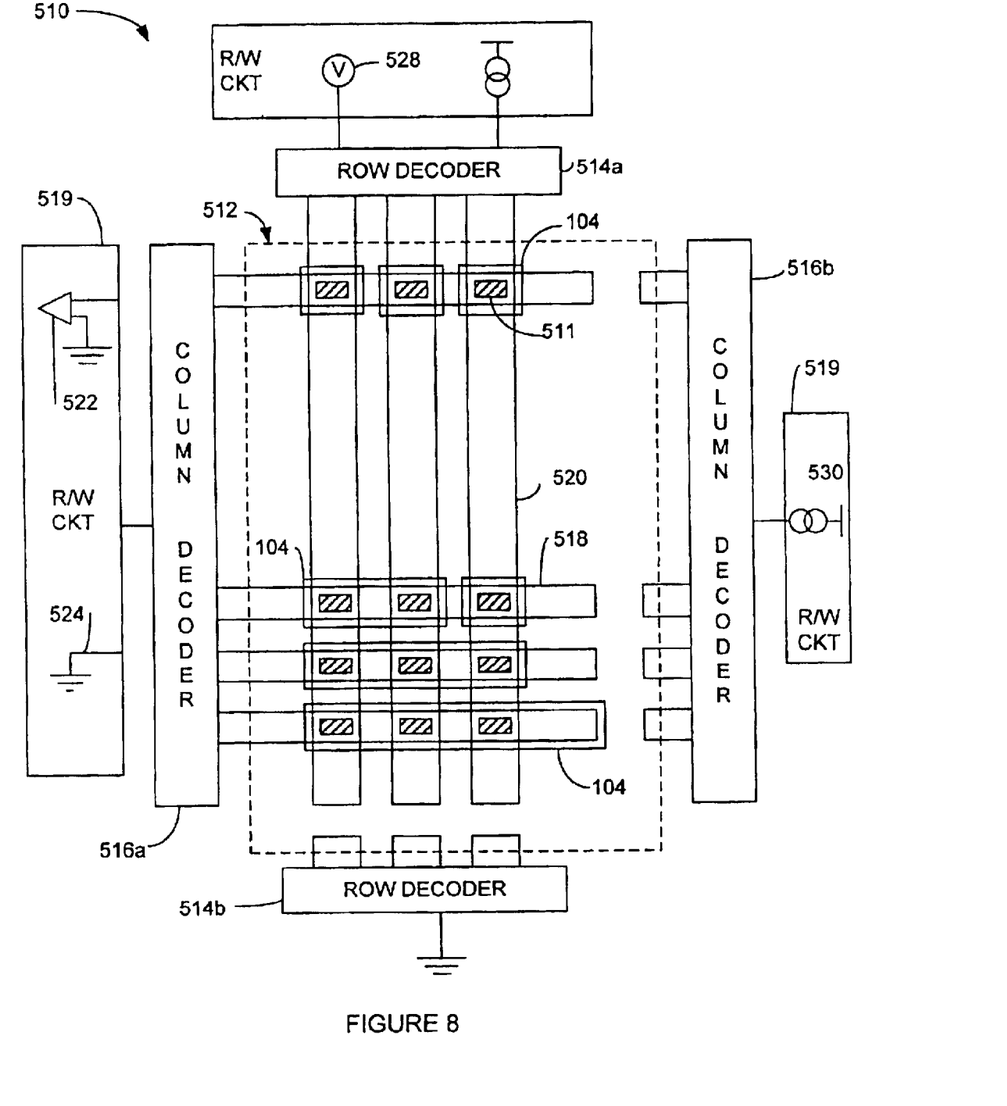
FIG. 8 illustrates a schematic diagram of a memory array with supporting logic as implemented within the present invention.

FIG. 8 illustrates a magnetic random access memory (MRAM) device 510 that includes word lines 518 and bit lines 520. Magnetic tunnel junctions 511 are located at cross points of word and bit lines 518 and 520. Magnetic tunnel junctions are fabricated to include the magnetic sink layer as found in the memory device 100 of FIG. 2. The magnetic tunnel junctions 511 are arranged in rows and columns, with the rows extending along an X direction and the columns extending along a Y direction. Only a relatively small number of magnetic tunnel junctions 511 are shown to simplify the illustration of the MRAM device 510. In practice, arrays of any size may be used.

Traces functioning as word lines 518 extend along the X direction in a plane on one side of the array 512. The word lines 518 are in contact with the pinned layers of the magnetic tunnel junctions 511. Traces functioning as bit lines 520 extend along the Y direction in a plane on an adjacent side of the array 512. The bit lines 520 are in contact with the pinning layers 106 of the magnetic tunnel junction 511. There may be one word line 518 for each row of the array 512 and one bit line 520 for each column of the array 512.

Seed layer 104 also is formed under junctions 511. In one example, the seed layer 104 is isolated so that each junction 511 has its own seed layer. In other word lines, it is shown that seed layer can extend to serve two or more junctions within the same word line. Since there is a separate conductor for each row, the seed layers cannot be shared among rows due to their metallic content. As such, the magnetic sink layer may extend over the top of the conductor and be shared amongst two or more bits along the word line, but not shared within the whole array 512.

The MRAM device 512 also includes first and second row decoders 514a and 514b, first and second column decoders 516a and 516b, and a read/write circuit 519. The read/write circuit 519 includes a sense amplifier 522, ground connectors 524, a row current source 526, a voltage source 528 and a column current source 530.

During a write operation on a selected magnetic tunnel junction 511, the first row decoder 514a connects one end of a selected word line 518 to the row current source 526, the second row decoder 514b connects an opposite end of the selected word line 518 to ground, the first column decoder 516a connects one end of a selected bit line 520 to ground, and the second column decoder 516b connects the opposite end of the selected bit line 520 to the column current source 530. As a result, write currents flow through the selected word and bit lines 518 and 520. The write currents create magnetic fields, which cause the magnetic tunnel junction 511 to switch. The column decoders 516a and 516b may also cause a write current to flow through the sense layer 518 crossing the selected magnetic tunnel junction 511.

During a read operation on a selected magnetic tunnel junction 511, the first row decoder 514a connects the voltage source 528 to a selected word line 518, and the first column decoder 518a connects a selected bit line 520 to a virtual ground input of the sense amplifier 522. In the meantime, the first and second column decoders 516a and 516b cause either a steady read current or a bipolar current pulse to flow through the read line crossing the selected magnetic tunnel junction 511. If a steady read current is supplied to a selected read line, the resistance state of the selected magnetic tunnel junction 511 is sensed by the sense amplifier 522. If a bipolar pulse is supplied to the selected read line, the sense amplifier 522 examines the transition of the junction resistance.

The magnetic tunnel junctions 511 are coupled together through many parallel paths. The resistance seen at one cross point equals the resistance of the magnetic tunnel junction 511 at that cross point in parallel with resistances of magnetic tunnel junctions 511 in the other rows and columns. Thus, the array 512 of a magnetic tunnel junction 511 may be characterized as a cross point resistor network.

Because the magnetic tunnel junctions 511 are connected as a cross point resistor network, parasitic or sneak path currents can interfere with the read operations on selected magnetic tunnel junctions 511. Blocking devices such as diodes or transistors may be connected to the magnetic tunnel junctions 511. These blocking devices can block the parasitic currents and may also have sink layers formed therewith.

In the alternative, the parasitic currents may be dealt with by using an "equipotential" method disclosed in commonly assigned U.S. Pat. No. 6,259,644, incorporated by reference for all purposes. If configured to use the equipotential method, the read/write circuit 518 may provide the same potential to the unselected bit lines 520 as the selected bit line 520, or it may provide the same potential to the unselected word lines 518 as the selected bit line 520.

The first row decoder 514a connects the voltage source 528 to a selected word line 518, and a first column decoder 516a connects one end of a selected bit line 520 to a virtual ground input of the sense amplifier 522. As a result, a sense current ($I_s$) flows through the selected magnetic tunnel junction 511 to the sense amplifier 522. The second column decoder 516b connects the column current source 530 to the other end of the selected bit line 520. As a result, a read current ($I_r$) flows through the selected bit line 520 to the sense amplifier 522. The read current ($I_r$) sets the magnetization vector of the reference layer. The sense amplifier 520 senses the sum of sense and read currents ($I_s+I_r$). Since the magnitude of the read current ($I_r$) is known, the magnitude of the sense current ($I_s$), and hence the resistance and logic states of the magnetic tunnel junction 511, can be determined.

Although the present invention has been described in connection with a TMR device, it is not so limited. The present invention may be applied to other types of magneto resistive devices that have similar operational characteristics. For instance, the present invention may be applied to giant magneto resistive (GMR) devices. A GMR device has the same basic configuration as a TMR device, except that the data and reference layers are separated by a conductive non-magnetic metallic layer, instead of an insulating tunnel barrier (barrier layer 110 of FIG. 2). The separation ranges from 0.5 to 3 nm. Exemplary spacer layer metals include gold, silver and copper. The relative orientations of the data and reference magnetization vectors affect in-plane resistance of GMR device.

It is to be understood that the above-referenced arrangements are only illustrative of the application for the principles of the present invention. Numerous modifications and alternative arrangements can be devised without departing from the spirit and scope of the present invention. The use of the sink layer as disclosed in the present invention is not limited to cross-point architecture or the equipotential method, but can be applied to other semiconductor-fabricated circuits that have stray magnetic fields at edge boundaries such as, for example, diodes or transistors, among others, which are also fabricated in stacks. Further, the spin-valve structure is not restricted to memory applications alone. The exact same structure may be used for field sensors and magnetic read heads for example. Each application will of course require redesign in the tunnel junction characteristics (TMR value, absolute resistance, coercivity, switching field, etc), but such redesign is well within the ability of the skilled artisan with only modest experimentation.

While the present invention has been shown in the drawings and fully described above with particularity and detail in connection with what is presently deemed to be the most practical and preferred embodiments(s) of the invention, it will be apparent to those of ordinary skill in the art that numerous modifications can be made without departing from the principles and concepts of the invention as set forth in the claims.

What is claimed is:

1. An array of magnetic memory devices comprising:
a plurality of sense lines;
a plurality of pinned layers, one for each of the magnetic memory devices within the array;
a plurality of barrier layers, one placed between a sense layer and each pinned layer;
a plurality of pinning layers running generally perpendicular to the plurality of sense lines and at least partially aligned with a portion of the pinned layer; and
at least one magnetic sink, the magnetic sink layer extending beyond the other layers, placed in electro-magnetic communication with at least one of the magnetic memory devices within an array, to modify magnetic field effects at the boundaries of the word line, a pinned layer, and a pinning line associated with the at least one magnetic memory device.

2. The magnetic memory array according to claim 1 wherein the magnetic sink comprises at least one seed layer having a first portion adjacent which an associated pinning layer is formed, the first portion functioning as a pinned layer, and a second portion extending beyond the other layers and the first portion.

3. The magnetic memory array according to claim 1 wherein the magnetic sink comprises a soft magnetic material.

4. The magnetic memory array according to claim 1 wherein the magnetic sink extends along one of the lines formed within the array.

5. The magnetic memory array according to claim 1 further comprising a conductive non-magnetic layer adjacent to the magnetic sink.

* * * * *